(12) United States Patent
Anderson et al.

(10) Patent No.: US 7,871,876 B2
(45) Date of Patent: Jan. 18, 2011

(54) METHOD OF FORMING A DUAL-PLANE COMPLEMENTARY METAL OXIDE SEMICONDUCTOR

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 12/014,850

(22) Filed: Jan. 16, 2008

(65) Prior Publication Data

US 2008/0113476 A1 May 15, 2008

Related U.S. Application Data

(62) Division of application No. 11/277,677, filed on Mar. 28, 2006, now Pat. No. 7,365,401.

(51) Int. Cl.
*H01L 21/336* (2006.01)
*H01L 21/8234* (2006.01)
*H01L 21/8238* (2006.01)
*H01L 27/12* (2006.01)
*H01L 21/70* (2006.01)
*H01L 29/04* (2006.01)

(52) U.S. Cl. ............ 438/198; 438/197; 438/199; 257/351; 257/368; 257/627; 257/628

(58) Field of Classification Search ............ 257/244, 257/249, 250, 270, 278, 314, 330, 349, 385, 257/407, E21.182, E29.193, 351, 368, 627, 257/628; 438/150, 159, 193, 198, 211, 230, 438/259, 270, 283, 149, 197, 199

See application file for complete search history.

(56) References Cited

U.S. PATENT DOCUMENTS

| | | | |
|---|---|---|---|
| 5,534,713 A | 7/1996 | Ismail et al. | |
| 6,319,799 B1 | 11/2001 | Ouyang et al. | |
| 6,855,989 B1 * | 2/2005 | Wang et al. ............... | 257/349 |
| 6,864,164 B1 * | 3/2005 | Dakshina-Murthy et al. ............... | 438/585 |
| 6,867,433 B2 * | 3/2005 | Yeo et al. .................. | 257/67 |
| 6,867,460 B1 * | 3/2005 | Anderson et al. .......... | 257/351 |
| 2004/0256639 A1 | 12/2004 | Ouyang et al. | |
| 2004/0256647 A1 | 12/2004 | Lee et al. | |
| 2005/0093021 A1 | 5/2005 | Ouyang et al. | |
| 2005/0127451 A1 | 6/2005 | Tsuchiya et al. | |

(Continued)

*Primary Examiner*—N Drew Richards
*Assistant Examiner*—Michael Jung
(74) *Attorney, Agent, or Firm*—Gibb I.P. Law Firm, LLC; Richard M. Kotulak, Esq.

(57) ABSTRACT

Embodiments herein present a device, method, etc. for a dual-plane complementary metal oxide semiconductor. The device comprises a fin-type transistor on a bulk silicon substrate. The fin-type transistor comprises outer fin regions and a center semiconductor fin region, wherein the center fin region has a {110} crystalline oriented channel surface. The outer fin regions comprise a strain inducing material that stresses the center semiconductor fin region. The strain inducing material contacts the bulk silicon substrate, wherein the strain inducing material comprises germanium and/or carbon. Further, the fin-type transistor comprises a thick oxide member on a top face thereof. The fin-type transistor also comprises a first transistor on a first crystalline oriented surface, wherein the device further comprises a second transistor on a second crystalline oriented surface that differs from the first crystalline oriented surface.

10 Claims, 20 Drawing Sheets

U.S. PATENT DOCUMENTS

2005/0130358 A1 6/2005 Chidambarrao et al.
2005/0145941 A1 7/2005 Bedell et al.
2005/0153486 A1* 7/2005 Xiang et al. ................. 438/149
2007/0145487 A1* 6/2007 Kavalieros et al. .......... 257/368

* cited by examiner

METHOD OF FORMING A DUAL-PLANE COMPLEMENTARY METAL OXIDE SEMICONDUCTOR

CROSS REFERENCE TO RELATED APPLICATIONS

This application is a divisional of U.S. application Ser. No. 11/277,677, filed Mar. 28, 2006, now U.S. Pat. No. 7,365,401 B2 (issued on Apr. 29, 2008), the complete disclosure of which, in its entirety, is herein incorporated by reference.

BACKGROUND

1. Field of the Invention

Embodiments herein present a device, method, etc. for a dual-plane complementary metal oxide semiconductor (CMOS).

2. Description of the Related Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever-increasing device densities is particularly strong in CMOS technologies, such as in the design and fabrication of field effect transistors (FETs). FETs are used in almost all types of integrated circuit design (i.e., microprocessors, memory, etc.). Unfortunately, increased device density in CMOS FETs often results in degradation of performance and/or reliability.

One type of FET that has been proposed to facilitate increased device density is a fin-type Field Effect Transistor. More specifically, in FinFETs, the body of the transistor is formed from a vertical structure, generally referred to as a "fin" for its resemblance to the dorsal fin on a fish. The gate of the finFET is then formed on one or more sides of the fin. FinFETs have several advantages, including better current control without requiring increased device size. FinFETs thus facilitate scaling of CMOS dimensions while maintaining an acceptable performance.

SUMMARY

Embodiments herein present a device, method, etc. for a dual-plane complementary metal oxide semiconductor. The device comprises a fin-type transistor on a bulk silicon substrate. The fin-type transistor comprises outer fin regions and a center semiconductor fin region, wherein the center fin region with a {110} crystalline oriented channel surface. The outer fin regions comprise a strain inducing material that stresses the center semiconductor fin region. The strain inducing material contacts the bulk silicon substrate, wherein the strain inducing material comprises germanium and/or carbon. Further, the fin-type transistor comprises a thick oxide member on a top face thereof. The fin-type transistor also comprises a first transistor on a first crystalline oriented surface, wherein the device further comprises a second transistor with a second crystalline oriented channel surface that differs from the first crystalline oriented channel surface.

Embodiments of the invention further comprise a method of forming a semiconductor device, comprising patterning a fin on a substrate, wherein a center of the fin is formed with a {110} crystalline oriented channel surface. Next, the method forms a gate over the center of the fin, and forms spacers around the gate. Following this, the method removes exposed portions of the fin and grows strain inducing source and drain regions, comprising silicon germanium and/or silicon carbon, on the substrate proximate the center of the fin, wherein the strain inducing source and drain regions apply stress to the center of the fin. The removing of the source and drain regions followed by regrowth of silicon germanium, is referred to as embedded silicon germanium.

The patterning of the fin, the forming of the gate, and the forming of the strain inducing source and drain regions comprises forming a first transistor, wherein the method further comprises forming a second transistor complementary to the first transistor. Moreover, the first transistor is formed on a first crystalline oriented surface; and, the second transistor is formed on a second crystalline oriented surface that differs from the first crystalline oriented surface. The method further comprises forming a thick oxide member on a top face of the first transistor and/or the second transistor.

Accordingly, embodiments herein present a dual-plane tri-gate with an embedded silicon-germanium source and drain on pFET and tensile nitride overlayer (to strain nFET) with wells or halos for Vt adjust. Embodiments of the invention present a tri-gate in a bulk silicon; embedded silicon-germanium on a pFET enabled by bulk silicon integration; and a pFET with {110} channel planes with nFET having {100} channel planes.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
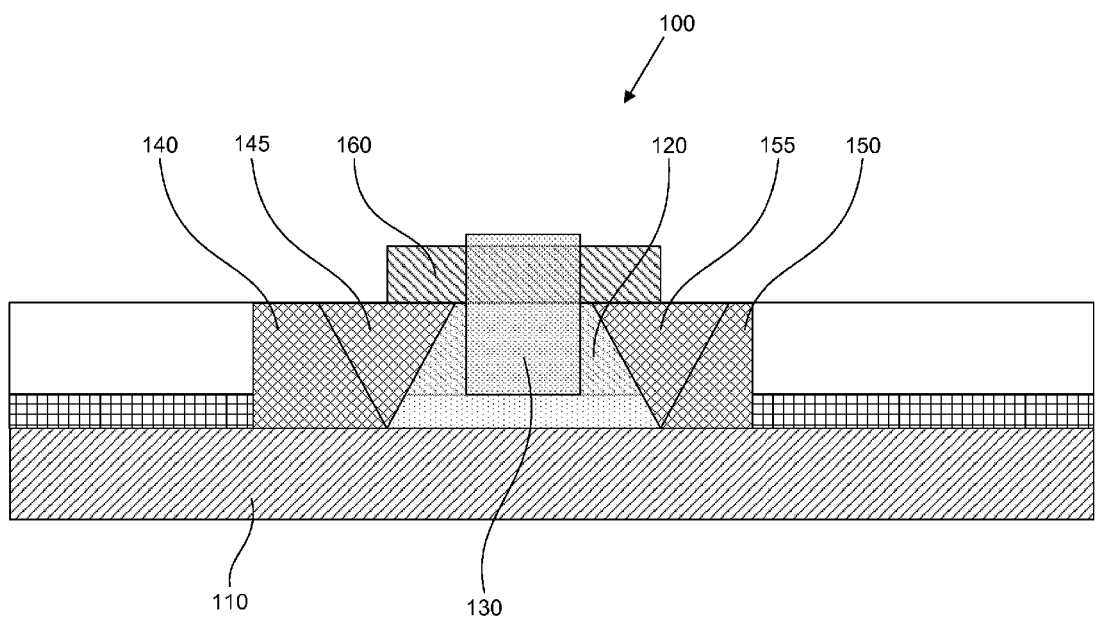
FIG. 1 is a diagram illustrating a cross-sectional view of a semiconductor device.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Embodiments herein present a dual-plane tri-gate with an embedded silicon-germanium source and drain on pFET and tensile nitride overlayer (to strain nFET) with wells or halos for Vt adjust. Embodiments of the invention present a tri-gate in a bulk silicon; embedded silicon-germanium on a pFET enabled by bulk silicon integration; and a pFET with {110} channel planes with nFET having {100} channel planes.

Figure 2:
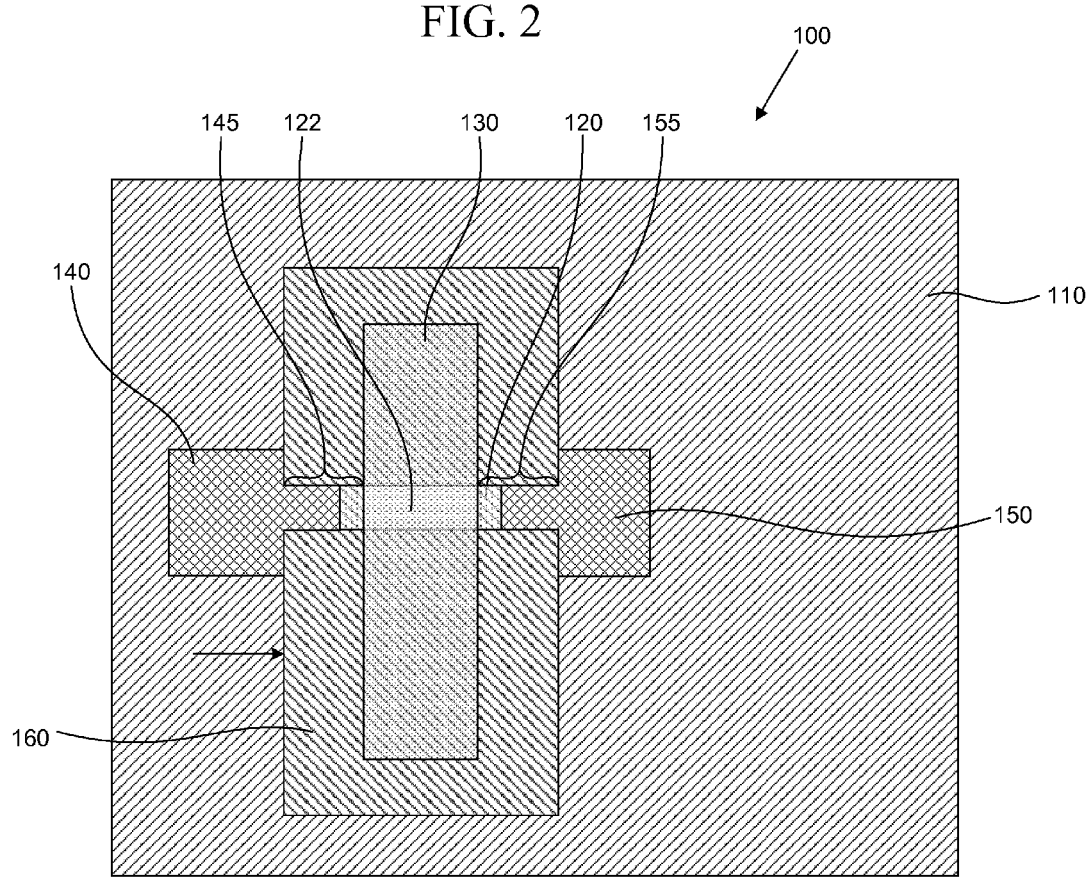
FIG. 2 is a diagram illustrating a top view of a semiconductor device.

Referring now to FIGS. 1-2, a semiconductor device 100 is shown on a bulk silicon substrate 110, wherein the semiconductor device 100 generally comprises a fin 120, a gate 130, a source 140, a drain 150, and spacers 160. More specifically, the bulk silicon substrate 110 is a standard bulk silicon wafer, which is typically formed in semiconductive material by implanting a well of either P-type or N-type conductivity silicon in a silicon substrate wafer of the opposite conductivity.

The fin 120 is formed as a vertical silicon structure extending from the bulk silicon substrate 110. The fin 120 comprises a channel region 122 in a middle portion thereof, wherein the channel region 122 is a region connecting the fin source region 145 and the fin drain region 155, as more fully described below. Source contact region 140, and drain contact region 150, are highly doped regions adjacent, and connect to fin source region 145, and fin drain region 155, respectively. The channel region 122 is doped so that the silicon comprises a semiconductor, which only becomes highly conductive when sufficient voltage/current is present in the gate 130.

The gate 130 is wrapped around and over the channel region 122 of the fin 120. While not shown in the Figures, various insulator layers separate the channel region 122 from the gate 130. As is common with FinFET technology, the gate 130 surrounds both side and top portions of the fin 120 along the channel region 122. When charged, the gate 130 creates an electromagnetic field that changes the conductivity of the channel region 122 and turns the semiconductor device 100 on or off. Moreover, once the gate 130 has been charged, negligible current is needed to keep the semiconductor device 100 on (closed).

The source 140 and the drain 150 contact regions are situated proximate end portions of the fin 120. Specifically, the source 140 and the drain 150 are heavily doped regions. Majority carriers flow into the channel region 122 through the source 140, through fin source region 145, and out through fin drain region 155, and the drain 150. U.S. Pat. No. 6,413,802 to Hu et al., which is incorporated herein by reference, discloses a finFET structure that includes a center fin that has a channel along its center and source and drains at the ends of the fin structure. The spacers 160 are deposited proximate the gate 130 by chemical vapor deposition. The spacers 160 passivate sidewalls of the gate 130 and isolate contact with the gate 130, the fin source region 145, and the fin drain region 155.

Figure 3:
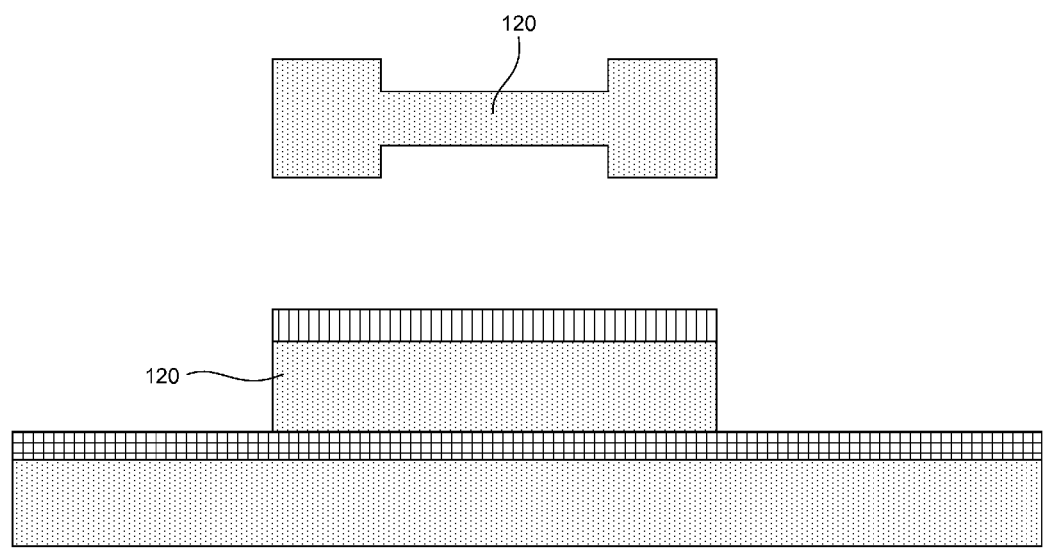
FIG. 3 is a diagram illustrating top and cross sectional views of a fin and a substrate.
Figure 4:
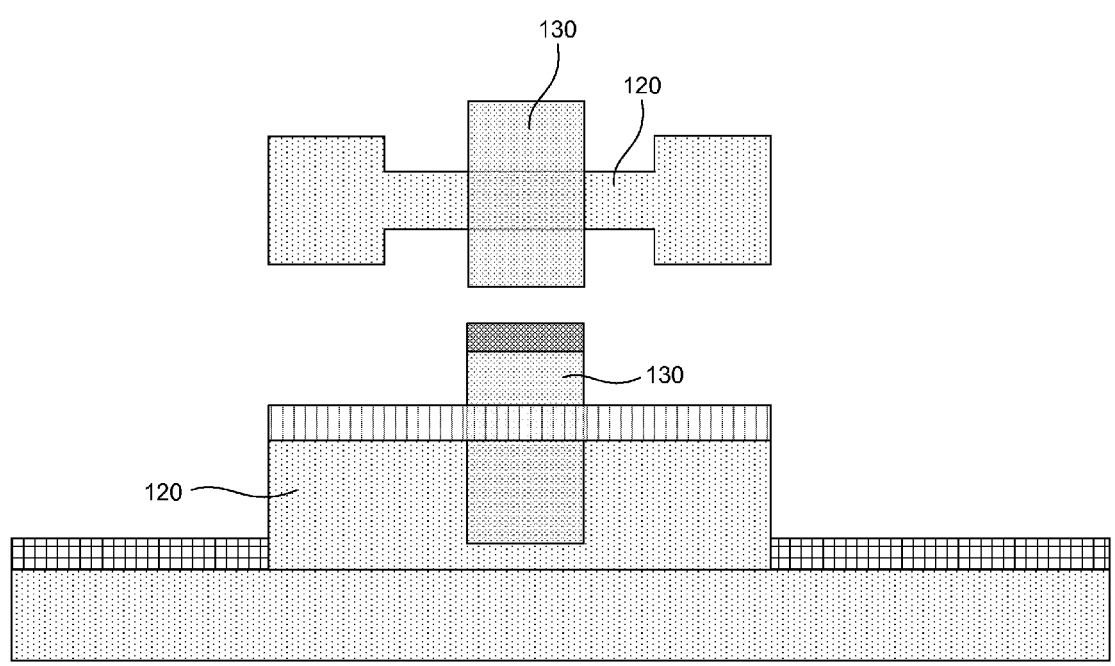
FIG. 4 is a diagram illustrating top and cross sectional views of a fin, a substrate, and a gate.
Figure 5:
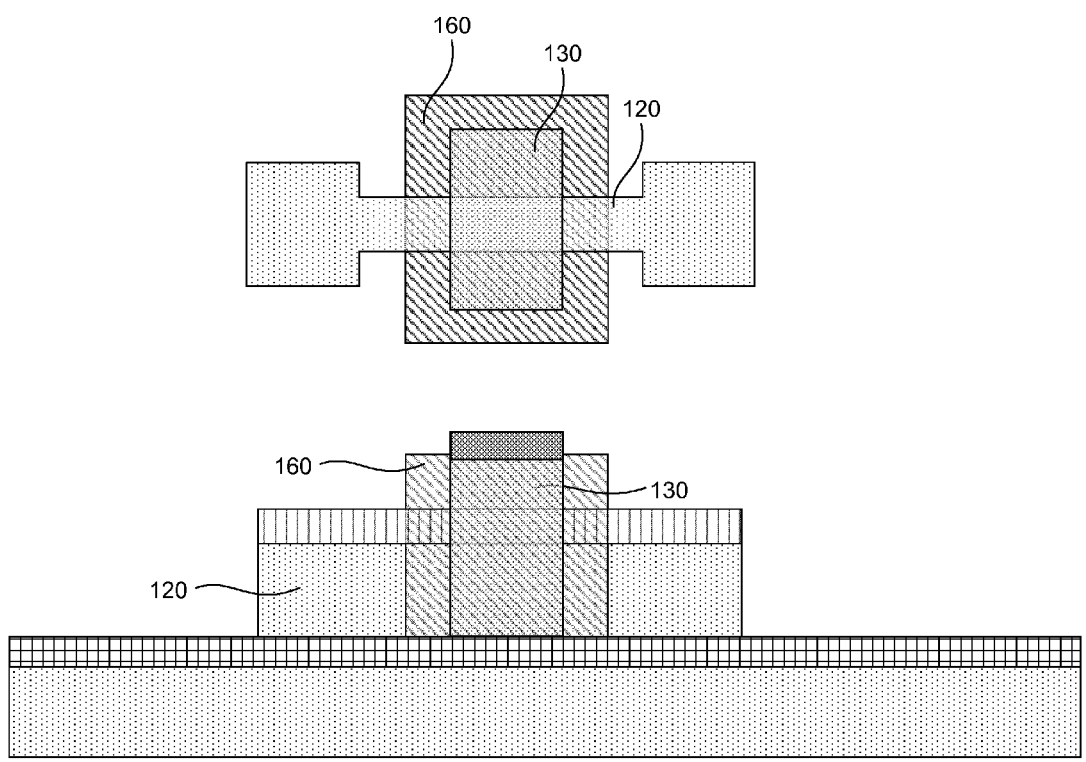
FIG. 5 is a diagram illustrating top and cross sectional views of a fin, a substrate, a gate, and spacers.
Figure 6:
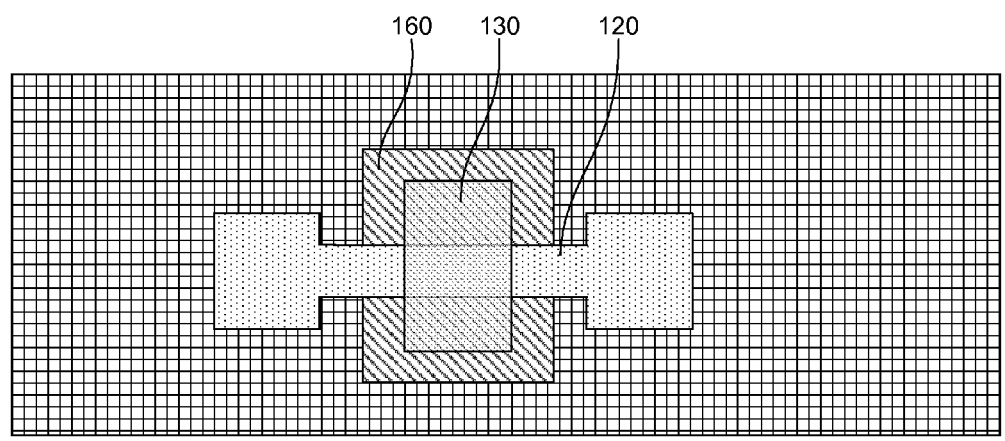
FIG. 6 is a diagram illustrating top and cross sectional views of a fin, a substrate, a gate, spacers, and dielectric material.
Figure 6:
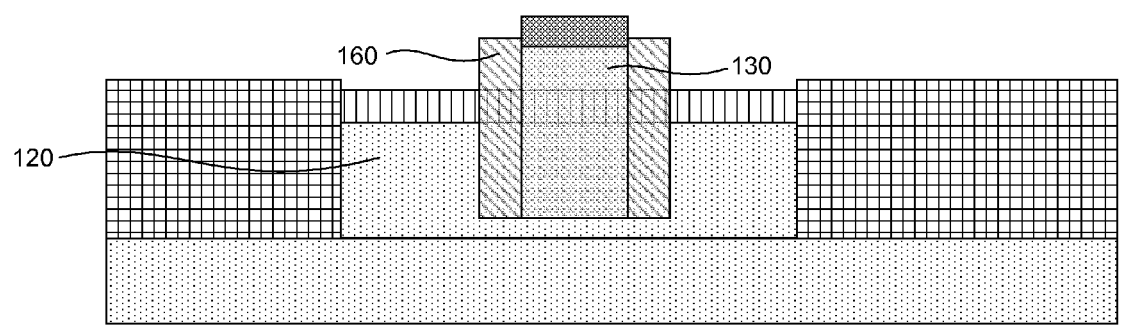

FIGS. 3-8 illustrate a method of forming a semiconductor device (i.e., the semiconductor device 100). As illustrated in FIG. 3, the method etches cap materials (Si3N4 over SiO2) and silicon to form fin (i.e., the fin 120) and source/drain contact region patterns. Moreover, exposed silicon surfaces are oxidized to form a sacrificial SiO2 layer, typically between 1 and 3 nm thick. This layer is then removed by chemical means such as etching with buffered HF. Next, as illustrated in FIG. 4, the method forms a gate dielectric on exposed silicon surfaces (SiO2-N or High-k) and forms a gate electrode (i.e., the gate 130) by deposition and patterning of metal or poly-silicon. Furthermore, implantation of extensions and halos into exposed fin sidewalls follows. Subsequently, as illustrated in FIGS. 5-6, the method forms spacers (i.e., the spacers 160) around the perimeter of the gate electrode and fills/planarizes with dielectric material (SiO2).

Figure 7:
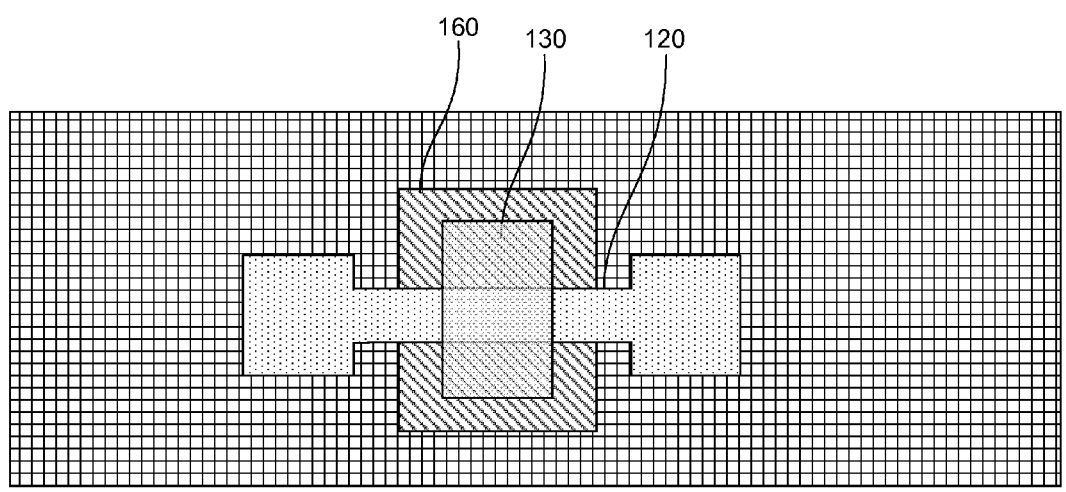
FIG. 7 is a diagram illustrating top and cross sectional views of a fin, a substrate, a gate, spacers.
Figure 7:
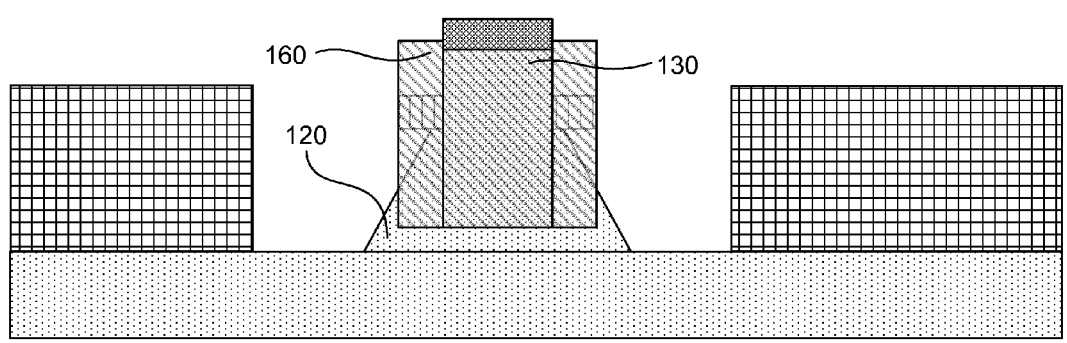
Figure 8:
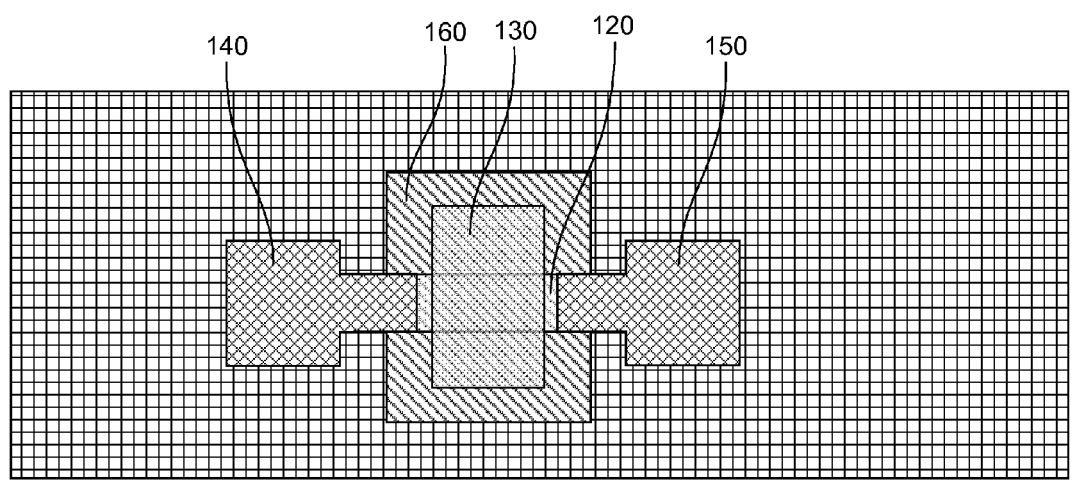
FIG. 8 is a diagram illustrating a top view of a fin, a substrate, a gate, spacers, a source, etched dielectric material, and a drain.
Figure 8:
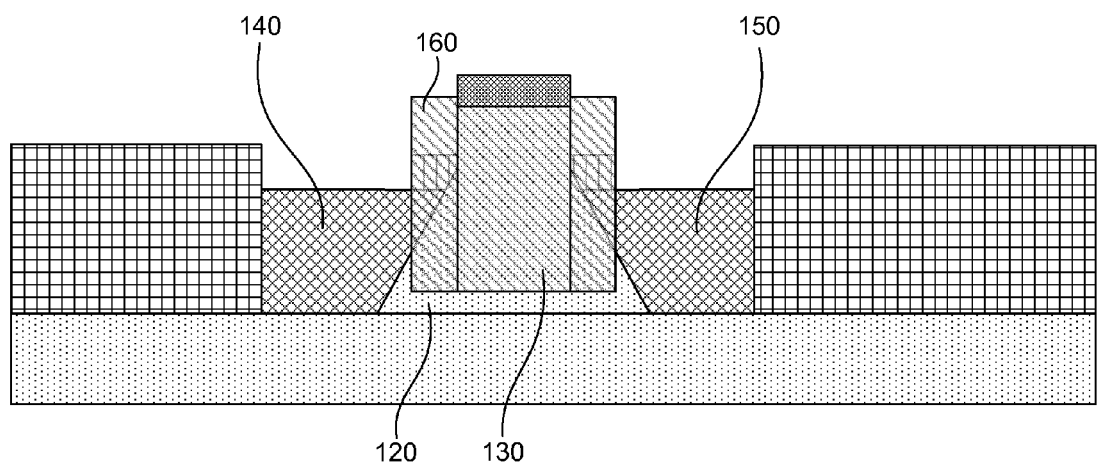

Following this, as illustrated in FIGS. 7-8, the method performs a silicon etch (isotropic and/or anisotropic etch) and grows silicon-germanium or silicon-carbon selectively on exposed silicon surfaces. In addition, the method implants ions into source/drain implants in the top surfaces of exposed fins and source/drain contact regions (i.e., the source 140 and the drain 150) and silicides exposed gate and source/drain regions.

Figure 9:
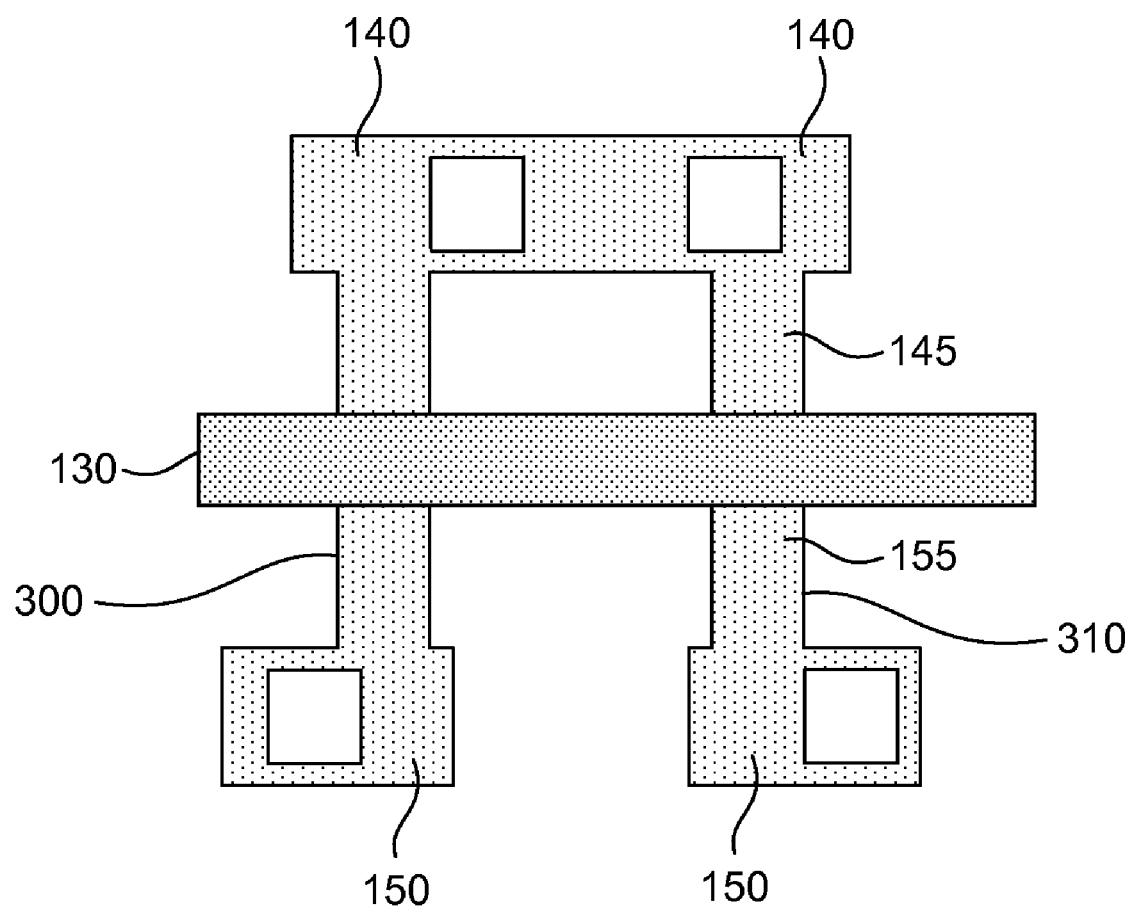
FIG. 9 is a diagram illustrating a top view of a portion of a semiconductor device having a hybrid orientation layout.

The foregoing description presents the semiconductor device 100 on a bulk silicon substrate 110 having a tri-gate layout. Referring to FIG. 9, it is contemplated in an embodiment of the invention, that the bulk silicon substrate 110 could comprise a hybrid orientation layout. US20040256700A1, Doris, et al., which is incorporated herein by reference, discloses a hybrid orientation substrate. In the hybrid orientation layout, the bulk silicon substrate 110 comprises a hybrid orientation substrate and includes a p-type FET (pFET) 300 with a {110} crystalline oriented channel surface and an n-type FET (nFET) 310 with a {100} crystalline oriented channel surface. The pFET 300 comprises epitaxial silicon germanium in the source and drain regions and the nFET 310 could comprise epitaxial silicon carbon in the source and drain regions. Moreover, the pFET 300 could have a thick oxide member 420 on a top surface thereof to avoid a low-mobility channel.

Figure 10A:
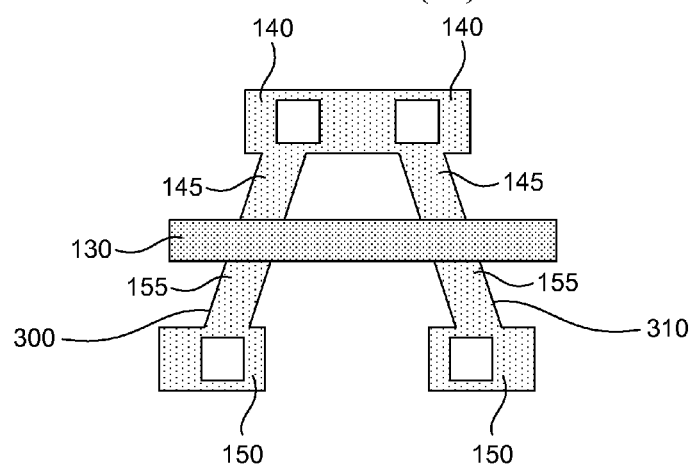
FIG. 10(a) is a diagram illustrating a top view of a portion of a semiconductor device having a Chevron layout.
Figure 10B:
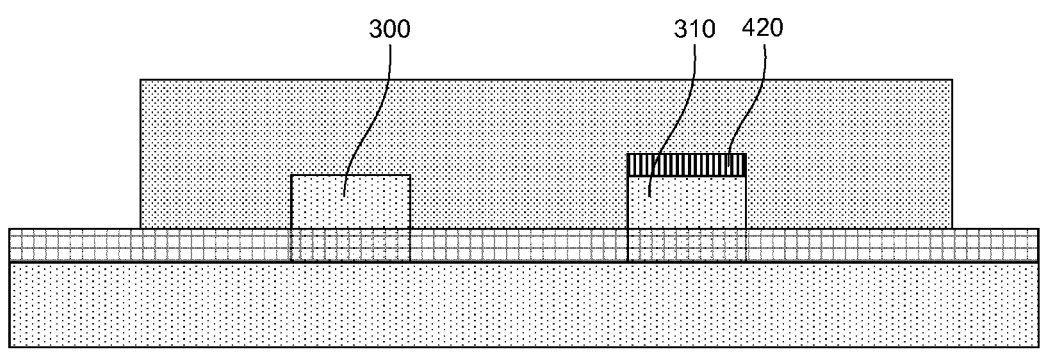
FIG. 10(b) is a diagram illustrating a cross-sectional view of a portion of a semiconductor device having a Chevron layout.
Figure 11A:
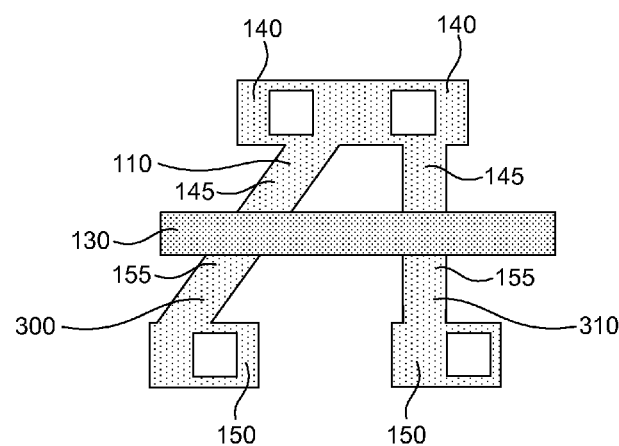
FIG. 11(a) is a diagram illustrating a top view of a portion of a semiconductor device having a Z-style layout.
Figure 11B:
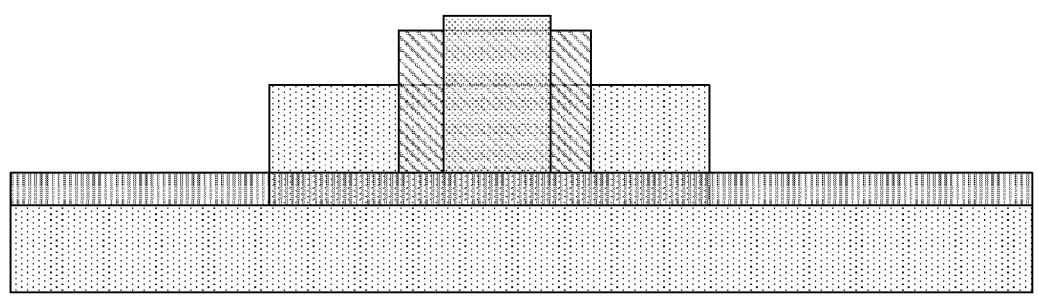
FIG. 11(b) is a diagram illustrating a cross-sectional view of a portion of a semiconductor device having a Z-style layout.

In FIGS. 10(*a*)-(*b*), it is contemplated in another embodiment of the invention, that the bulk silicon substrate 110 could comprise a Chevron layout. The Chevron layout is similar to the hybrid orientation layout, except the Chevron layout comprises a wafer rotated approximately 22.5 degrees. In FIGS. 11(*a*)-(*b*), it is contemplated in yet another embodiment of the invention, that the bulk silicon substrate 110 could comprise a Z-style layout. The Z-style layout is similar to the Chevron layout, except the Z-style layout comprises a wafer rotated approximately 45 degrees. U.S. Pat. No. 6,867,460 to Anderson et al., which is incorporated herein by reference, discloses finFET structures having Chevron layouts.

Figure 12A:
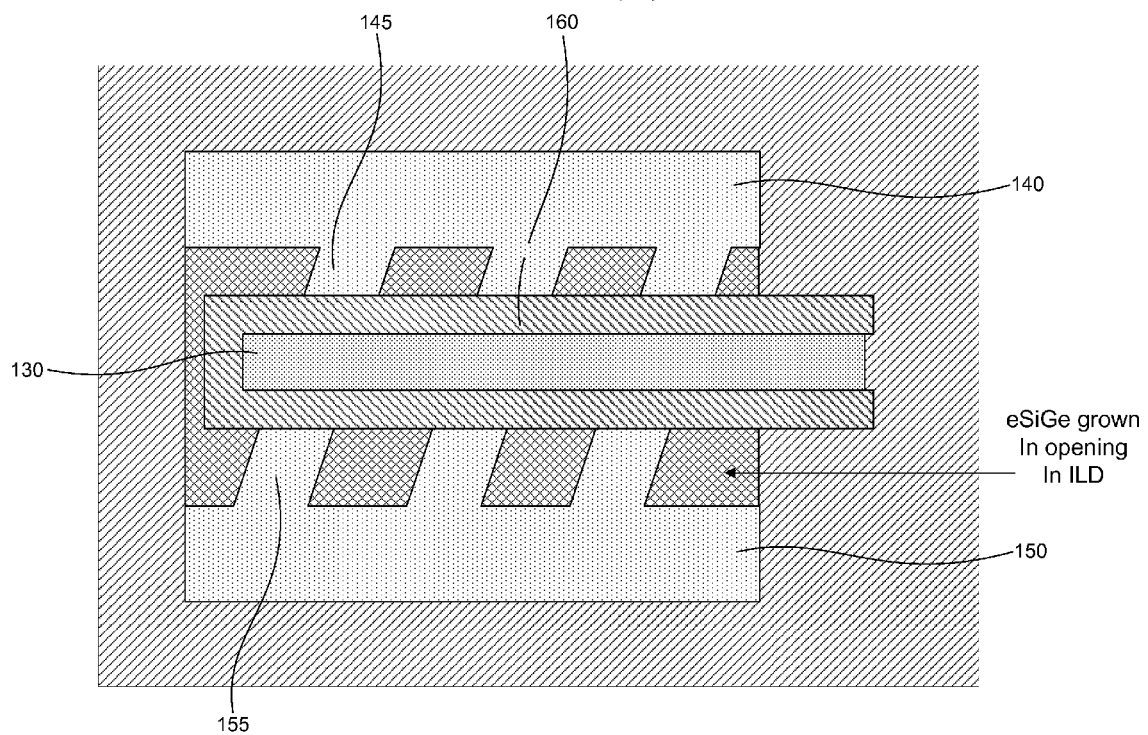
FIG. 12(a) is a diagram illustrating a top view of a portion of a semiconductor device having an interdigitated SiGe tri-gate FET layout.
Figure 12B:
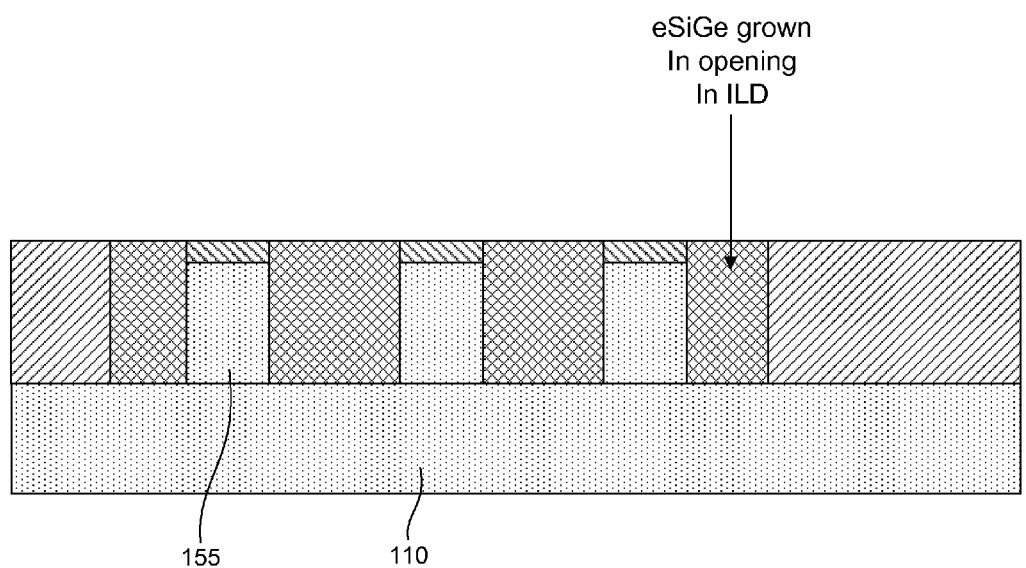
FIG. 12(b) is a diagram illustrating a cross-sectional view of a portion of a semiconductor device having an interdigitated SiGe tri-gate FET layout.

In still another embodiment of the invention, as illustrated in FIG. 12(*a*), the bulk silicon substrate 110 could comprise an interdigitated SiGe tri-gate FET layout.

In such an embodiment, epitaxial silicon germanium could be grown selectively in the openings formed between the spacers 160 adjacent to the gate electrode, and the source 140 and drain 150 contact regions, with a mask. Moreover, as illustrated in FIG. 12(*b*), epitaxial silicon germanium could be grown in openings in an inter layer dielectric.

Figure 13A:
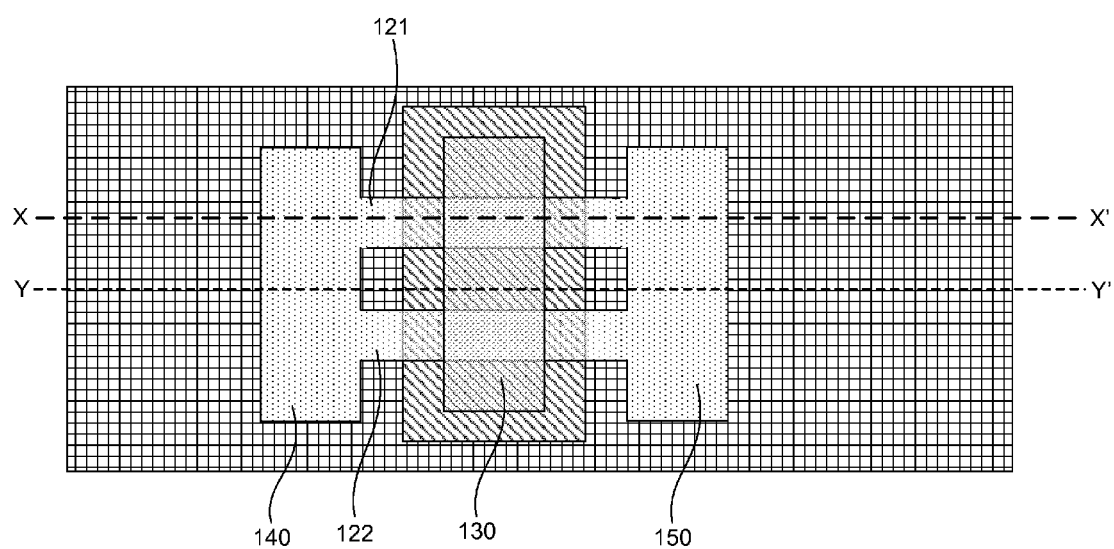
FIG. 13(a) is a diagram illustrating a top view of fins and a substrate.
Figure 13B:
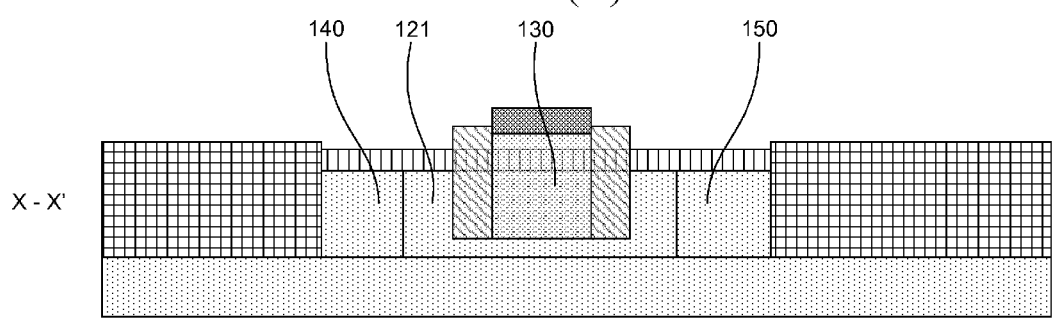
FIGS. 13(b) and 13(c) are diagrams illustrating cross-sectional views of fins and a substrate.
Figure 13C:
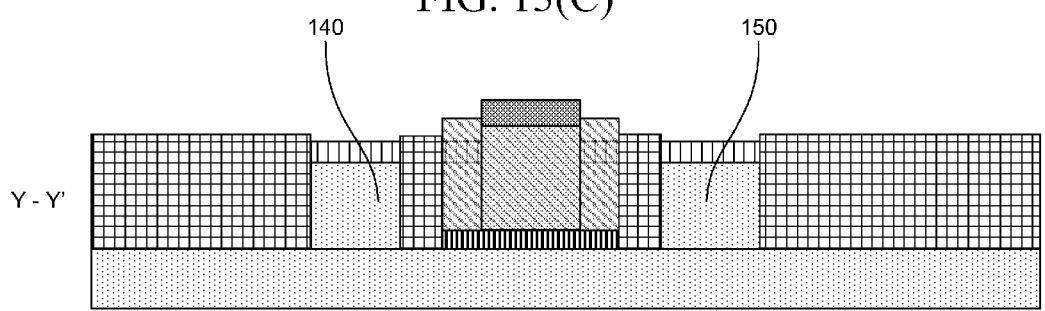
Figure 14A:
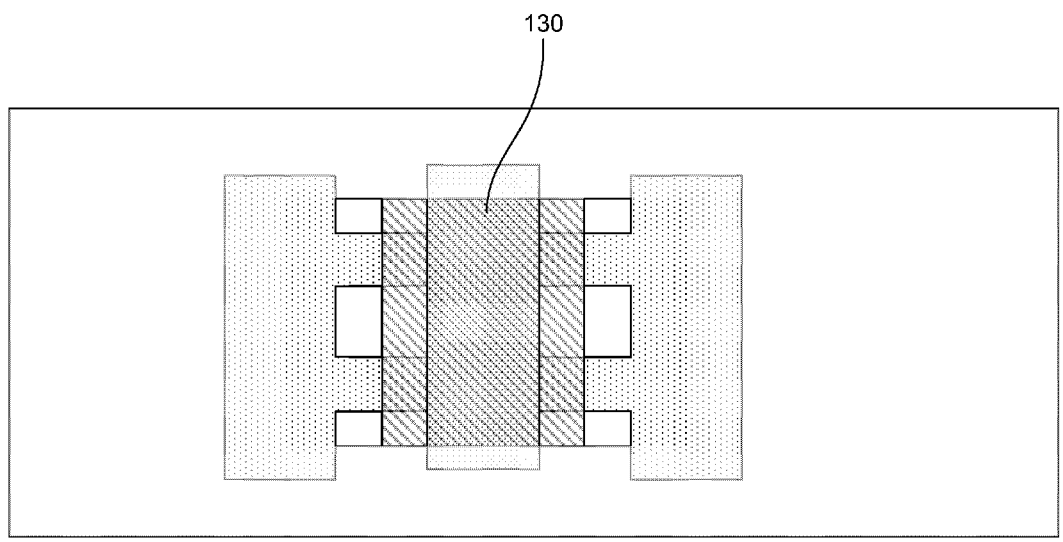
FIG. 14(a) is a diagram illustrating a top view of a mask over fins and a substrate.
Figure 14B:
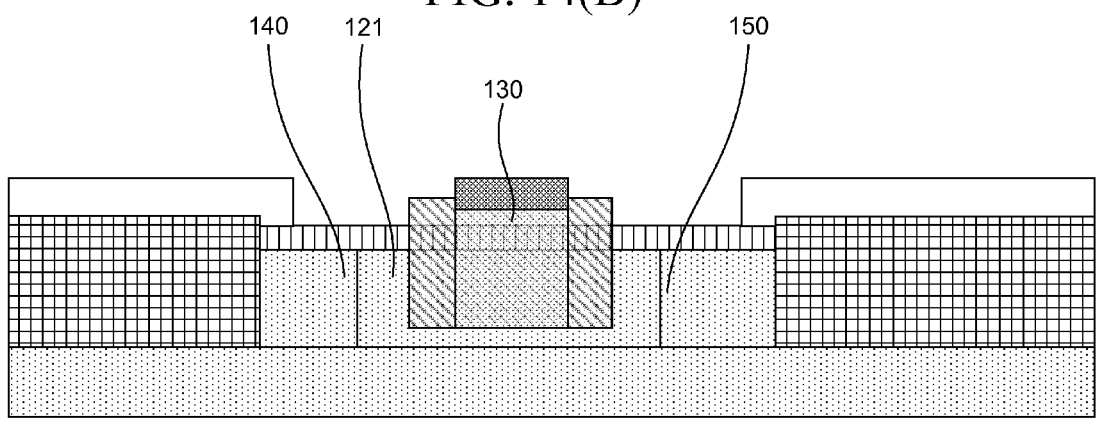
FIGS. 14(b) and 14(c) are diagrams illustrating cross-sectional views of a mask over fins and a substrate.
Figure 14C:
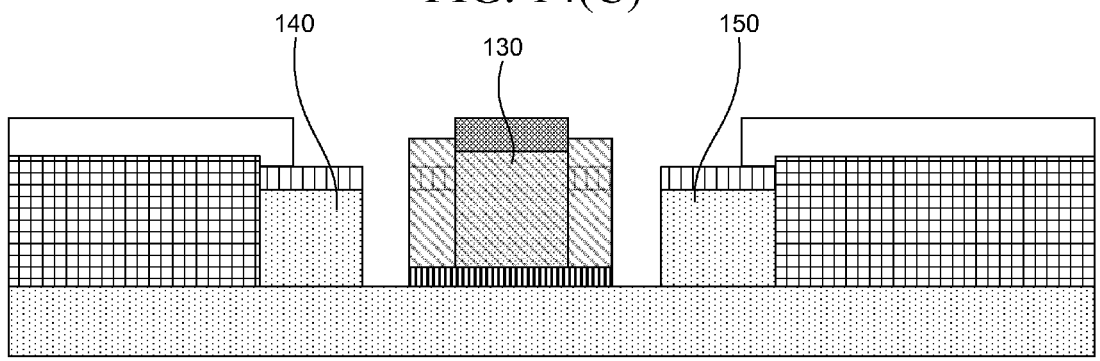
Figure 15A:
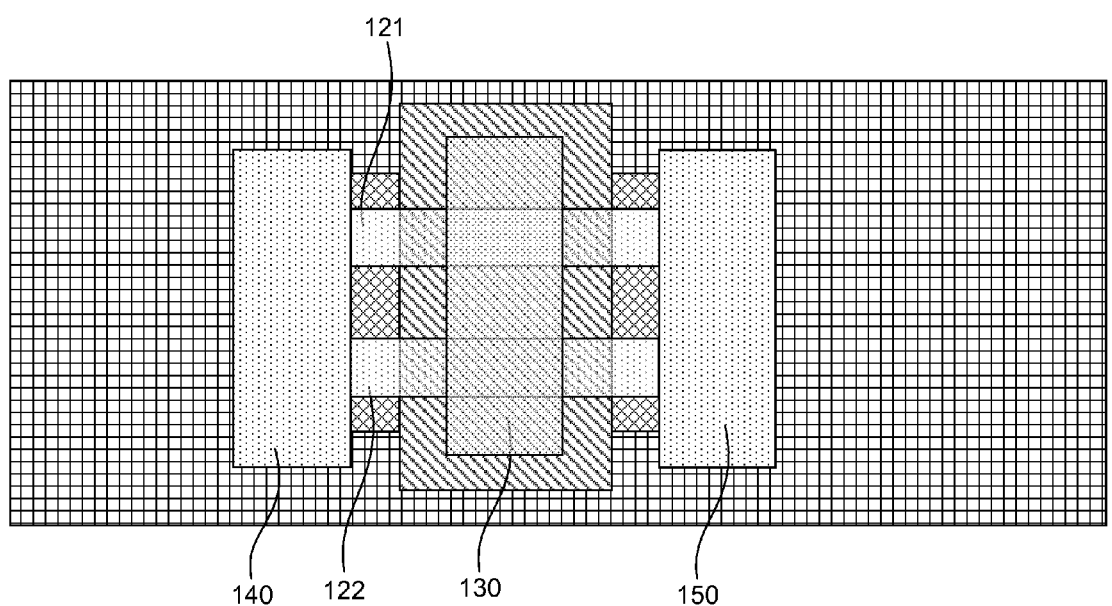
FIG. 15(a) is a diagram illustrating a top view of fins, a substrate, and SiGe (or SiC) selectively grown on exposed silicon surfaces in openings.
Figure 15B:
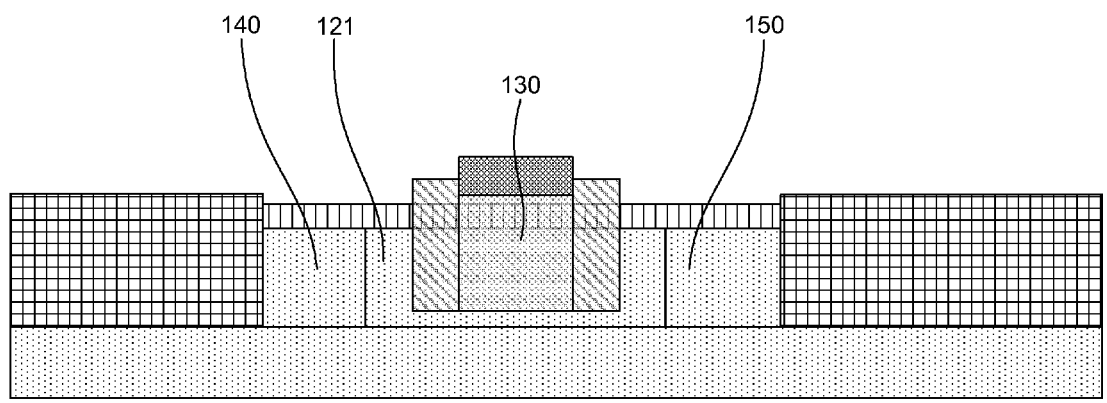
FIGS. 15(b) and 15(c) are diagrams illustrating cross-sectional views of fins, a substrate, and SiGe (or SiC) selectively grown on exposed silicon surfaces in openings.
Figure 15C:
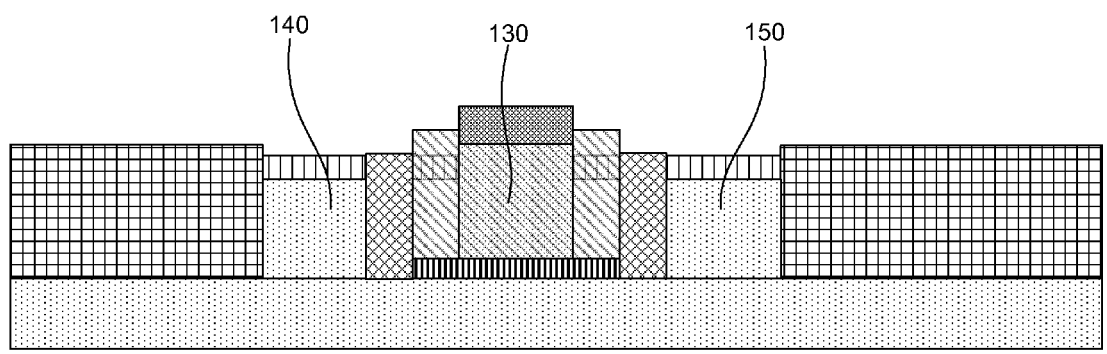

FIGS. 13(*a*)-15(*c*) illustrate a method of forming a bulk silicon substrate 110 having an interdigitated SiGe tri-gate FET layout. In FIG. 13(*a*), the method begins with fins 121 and 122, source/drain regions 140 and 150, and gate 130. There is a dielectric cap left on the source/drain, fin and contact regions. FIG. 13(*b*) illustrates a cross section of FIG. 13(*a*) at line X; and FIG. 13(*c*) illustrates a cross section of FIG. 13(*a*) at line Y. In FIGS. 14(*a*), 14(*b*), and 14(*c*), the method masks the region over the FET and etches back the dielectric fill selectively. Following this, as illustrated in FIGS. 15(*a*), 15(*b*), and 15(*c*), the method strips the resist and selectively grows SiGe (or SiC) on exposed silicon surfaces in openings.

Thus, embodiments herein present a device, method, etc. for a dual-plane complementary metal oxide semiconductor. The device comprises a fin-type transistor (i.e., the semiconductor device 100) on a bulk silicon substrate (i.e., the bulk silicon substrate 110). The fin-type transistor comprises outer fin regions (i.e., the source 140 and the drain 150, and fin source and drain regions 145, and 155, respectively; also referred to herein as "source and drain fin regions") and a center semiconductor fin region (i.e., the channel region 122 of the fin 120; also referred to herein as the "channel fin regions"), wherein the center fin region has a {110} crystalline oriented channel surface.

The outer fin regions comprise a strain inducing material that contacts the bulk silicon substrate, wherein the strain inducing material strains the center semiconductor fin region. The strain inducing material may comprise silicon-germanium and/or silicon-carbon, or other suitable semiconductor material. As described above, the fin is formed as a vertical silicon structure extending from the bulk silicon substrate. Further, the center semiconductor fin region is doped so that the silicon comprises a semiconductor, which only becomes highly conductive when sufficient voltage/current is present in a gate.

In addition, the fin-type transistor comprises a gate (i.e., the gate 130), a source (i.e., the source 140 and fin source region 145), a drain (i.e., the drain 150 and fin drain region 155), and spacers (i.e., the spacers 160). As described above, the gate is wrapped around and over the center semiconductor fin region. When charged, the gate creates an electromagnetic field that changes the conductivity of the center semiconductor fin region and turns the fin-type transistor on or off. The source and the drain are heavily doped regions of the fin and the adjacent semiconductor contact regions, wherein majority carriers flow into the center semiconductor fin region through the source and out through the drain. The spacers passivate sidewalls of the gate and isolate contact with the gate, the source, and the drain.

Moreover, the fin-type transistor comprises a thick oxide member (i.e., the thick oxide member 420) on a top face thereof. The fin-type transistor also comprises a first transistor with a first crystalline oriented channel surface, wherein the device further comprises a second transistor with a second crystalline oriented channel surface that differs from the first crystalline oriented surface. For example, the device could comprise a pFET with a {110} crystalline oriented channel surface and an nFET with a {100} crystalline oriented channel surface. In addition, silicon germanium or silicon carbon is adjacent to and interdigitated with the outer fin regions so as to result in strained fin channels.

Embodiments of the invention further comprise a method of forming a semiconductor device (i.e., the semiconductor device 100). The method patterns a fin (i.e., the fin 120) on a substrate (i.e., the bulk silicon substrate 110), wherein a center of the fin has a {110} crystalline oriented channel surface. The patterning of the fin comprises forming a channel region in a middle portion of the fin, wherein the channel region is a high conductivity region connecting a source and a drain, as more fully described below. The channel region is doped so that it comprises a semiconductor, which only becomes conductive when sufficient voltage/current is present in a gate.

Next, the method forms a gate (i.e., the gate 130) over the center of the fin, and forms spacers (i.e., the spacers 160) around the gate. As described above, when charged, the gate creates an electromagnetic field that changes the conductivity of the channel region and turns the semiconductor device on or off. Moreover, once the gate has been charged, negligible current is needed to keep the semiconductor device on (closed). Furthermore, the spacers passivate sidewalls of the gate and isolate contact with the gate, a source, and a drain.

Following this, the method removes exposed portions of the fin and source and drain contact regions that are not protected by the gate or spacers and grows strain inducing source and drain regions selectively on exposed silicon surfaces of the substrate (i.e., the source 140 and the drain 150, and the fin source and drain regions, 145 and 155, respectively). The growing of the strain inducing source and drain regions comprises growing silicon germanium and/or silicon carbon, proximate the center of the fin, wherein the strain-inducing source and drain regions apply stress to the center of the fin. The etch to remove these regions may be a isotropic or anisotropic so as to position the growth region close to the channel region of the fin to maximize strain in the channel, but not so close as to degrade the quality of the channel silicon. As described above, the source and drain regions are heavily doped regions in the substrate. Majority carriers flow into the channel region through the source and out through the drain.

The patterning of the fin, the forming of the gate, and the forming of the source and drain regions comprises forming a first transistor, wherein the method further comprises forming a second transistor complementary to the first transistor. Specifically, the first transistor is formed with a first crystalline oriented channel surface; and, the second transistor is formed with a second crystalline oriented channel surface that differs from the first crystalline oriented surface. For example, the device could comprise a pFET with a {110} crystalline oriented channel surface and an nFET with a {100} crystalline oriented channel surface. The method further comprises forming a thick oxide member (i.e., the thick oxide member 420) on a top face of the first transistor and/or the second transistor. In addition, the method comprises growing strained silicon on exposed sides of the strain inducing source and drain regions.

Figure 16:
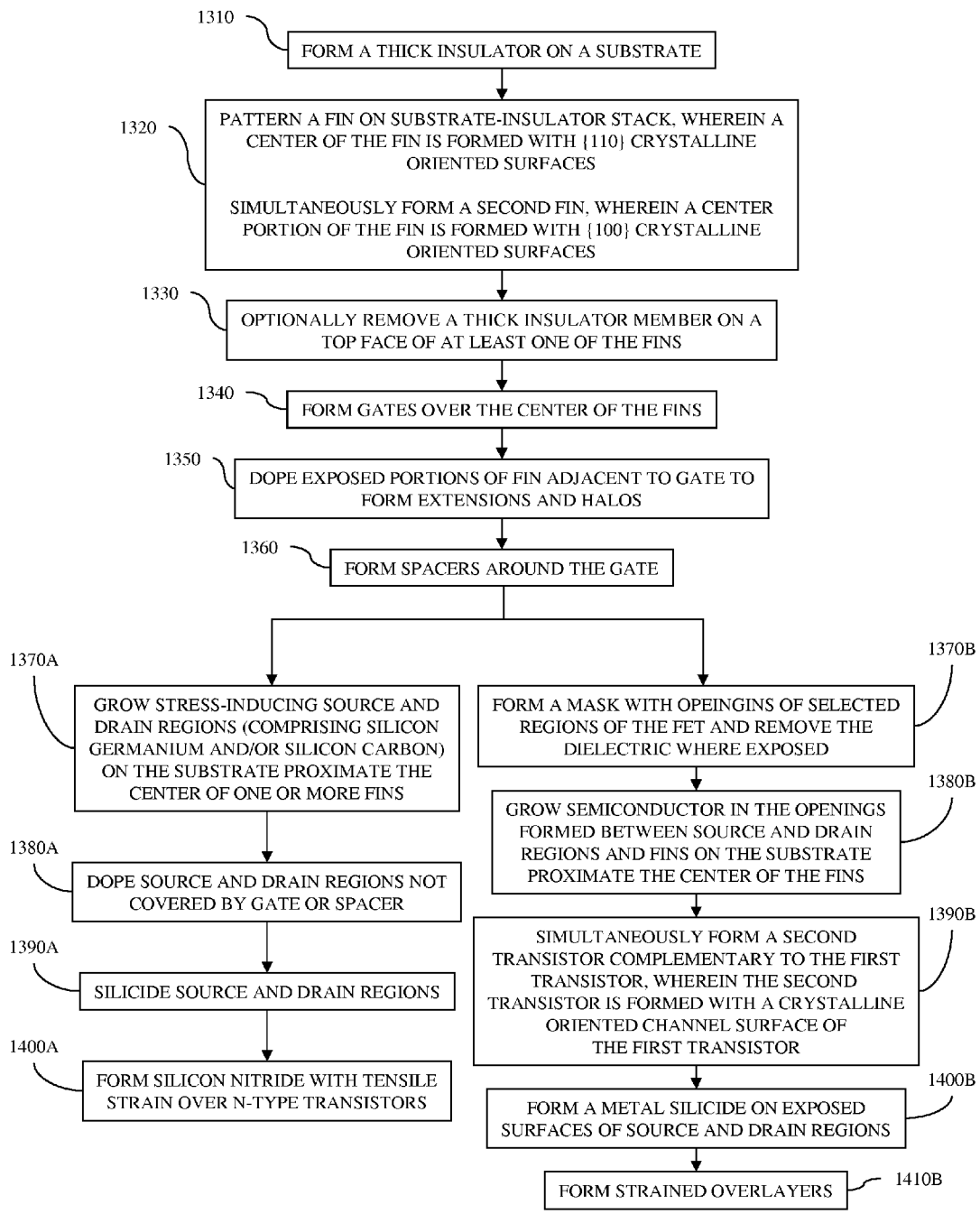
FIG. 16 is a flow diagram illustrating a method of the invention.

FIG. 16 illustrates a flow diagram of a method for forming a dual-plane complementary metal oxide semiconductor. In item 1310 the method begins by forming a thick insulator on a substrate. In item 1320, the method proceeds by patterning fins (e.g., the fin 120), with thick oxide member, on a substrate (i.e., the bulk silicon substrate 110), wherein a center of the fin is formed with at least one {110} crystalline oriented surface. As described above, the fin is formed as a vertical silicon structure extending from the substrate. The fin comprises a center channel region (i.e., the channel region 122) that is doped so that the silicon comprises a semiconductor, which only becomes conductive when sufficient voltage/current is present in a gate.

Next, in 1330, a thick oxide member (i.e., the thick oxide member 420) is optionally removed on the top face at least one transistor. As described above, the thick oxide member is formed to avoid a low-mobility channel when present.

The gate (i.e., the gate 130) is formed over the channel region of the fin in item 1340. The gate comprises a conductive gate electrode, (e.g. polysilicon) and a dielectric cap above, and may further comprise a gate dielectric between the fin and the conductive gate electrode. As described above, the gate is wrapped around and over the channel region. When charged, the gate creates an electromagnetic field that changes the conductivity of the channel region and turns the FETs on or off. Moreover, once the gate has been charged, negligible current is needed to keep the FETs on (closed). Optionally, extension and halo regions are formed by doping the regions of the fins that are not covered by the gate (item 1350).

Next, in item 1360, spacers (i.e., the spacers 160) are formed around the gate. The spacers passivate sidewalls of the gate and isolate contact with the gate, a source region, and a drain region. Doping of the fins with n-type dopant for n-type FETs and p-type for p-type FETs may optionally be added at this point. Next a dielectric is deposited and planarized to the expose the tops of the gate cap. The dielectric is then further recessed (by selective etch) until the tops of the caps over the fin and source/drain contact regions are exposed. At this point two embodiments are represented by two branches in FIG. 16. In the first branch, next a mask is formed with openings over selected regions of the FET, and portions of the fins and the source and drain regions are removed where exposed. These portions of fins, source and drain regions may, in particular, be etched to the point of exposing the substrate to allow for enhanced strain transfer in subsequent steps, when these regions are regrown.

Following this, in item 1370A, the method grows source and drain regions (i.e., the source 140 and the drain 150) on the substrate proximate the center of the fin to complete a first transistor. The source and drain regions comprise strain inducing silicon germanium and/or silicon carbon. As described above, the source and drain regions are heavily doped regions in the substrate, wherein majority carriers flow (item 1370A).

Metal silicide is next formed on the source and drain regions (item 1390A).

Finally strained overlayers, typically comprising tensile silicon nitride, are formed to complete the structure (item 1400A).

Returning to the step following item 1360, the second branch in FIG. 16 is described. Next a mask is formed with openings of selected regions of the FET and the dielectric of the previous step is removed where exposed (item 1370B). In these exposed regions the removed dielectric may be etched to the point of exposing the substrate to allow for enhanced strain transfer in subsequent steps.

Following this, the method grows semiconductor in the openings previously formed between source and drain regions and fins (i.e., the source 140 and the drain 150) on the substrate proximate the center of the fins (item 1380B). These regions are interdigitated with source and drain regions, and comprise strain inducing silicon germanium and/or silicon carbon. As described above, the source and drain regions are heavily doped regions in the substrate, wherein majority carriers flow into the channel region of the fin through the source region and out through the drain region.

A second transistor complementary to the first transistor is simultaneously formed in the above steps, wherein the second transistor is formed with a crystalline oriented channel surface that differs from the crystalline oriented channel surface of the first transistor (item 1390B). For example, the CMOS could comprise a pFET with a {110} crystalline oriented channel surface and an nFET on a {100} crystalline oriented channel surface.

Next a metal silicide is formed on exposed surfaces of source and drain regions (item 1400B).

Finally strained overlayers, typically comprising tensile silicon nitride, are formed to complete the structure (item 1410B).

Accordingly, embodiments herein present a dual-plane tri-gate with an embedded silicon-germanium source and drain on pFET and tensile nitride overlayer (to strain nFET) with wells or halos for Vt adjust. Embodiments of the invention present a tri-gate in a bulk silicon; embedded silicon-germanium source and drain on a pFET enabled by bulk silicon integration; and a pFET on {110} planes with nFET on {100} planes.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of forming a dual-plane complementary metal oxide semiconductor (CMOS) device, comprising:
    patterning a first fin on a {110} crystalline oriented surface of a first substrate;
    patterning a second fin on a {100} crystalline oriented surface of a second substrate, said second substrate being bonded and adjacent to said first substrate in said dual-plane CMOS device;
    forming a first tri-gate over said first fin and a second tri-gate over said second fin;
    forming a first spacer around said first tri-gate and portions of said first fin, and a second spacer around said second tri-gate and portions of said second fin;

depositing a dielectric on portions of said first and second substrates not covered by said first and second fins and said first and second spacers;

etching portions of said dielectric and said first and second fins to expose portions of said first and second substrates;

forming first and second strain inducing source/drain regions, within said etched portions, on said first and second substrates, respectively, wherein said first strain inducing source/drain regions are not recessed into said first substrate and apply stress to said first fin of a p-type fin type field effect transistor (p-FinFET), and wherein said second strain inducing source/drain regions are not recessed into said second substrate and apply stress to said second fin of a n-type fin type field effect transistor (n-FinFET); and forming a tensile strain layer over at least said n-FinFET.

2. The method according to claim 1, further comprising growing a first strain inducing material on said first substrate proximate to portions of said first spacer surrounding said first fin, and a second strain inducing material on said second substrate proximate to portions of said second spacer surrounding said second fin.

3. The method according to claim 1, further comprising forming a thick oxide member on a top face of said p-FinFET.

4. The method according to claim 1, wherein said first strain inducing source/drain region comprises at least one of silicon germanium and silicon carbon.

5. A method of forming a dual-plane complementary metal oxide semiconductor (CMOS) device, comprising:

patterning a first fin on a {110} crystalline oriented surface of a first substrate and a first fin source region and a first fin drain region at each respective longitudinal end of said first fin;

patterning a second fin on a {100} crystalline oriented surface of a second substrate and a second fin source region and a second fin drain region at each respective longitudinal end of said second fin, said second substrate being bonded and adjacent to said first substrate in said dual-plane CMOS device;

forming a first tri-gate over said first fin and a second tri-gate over said second fin, wherein said first and second tri-gates are formed on sidewalls and a top surface of each of said first and second fins;

forming a first spacer around said first tri-gate and portions of said first fin adjacent to said first tri-gate, and a second spacer around said second tri-gate and portions of said second fin adjacent to said second tri-gate;

depositing a dielectric on portions of said first substrate and said second substrate not covered by said first and second fins and said first and second spacers;

removing portions of said dielectric and portions of said first and second fins not covered by said first and second spacers, respectively, to expose portions of said first and second substrates;

growing a first strain inducing material on said exposed portions of said first substrate to form first strain inducing source and drain regions that are not recessed into said first substrate, wherein said first strain inducing material applies a stress to said first fin of a tri-gate p-FinFET in said dual-plane CMOS device;

growing a second strain inducing material on said exposed portions of said second substrate to form second strain inducing source and drain regions that are not recessed into said second substrate, wherein said second strain inducing material applies stress to said second fin of a tri-gate n-FinFET in said dual-plane CMOS device; and forming a tensile strain layer over at least said tri-gate n-FinFET.

6. The method according to claim 5, wherein said first strain inducing material comprises at least one of silicon germanium and silicon carbon, and said second strain inducing material comprises at least one of silicon germanium and silicon carbon.

7. The method according to claim 5, further comprising forming a thick oxide member on a top face of said p-FinFET.

8. A method of forming a dual-plane complementary metal oxide semiconductor (CMOS) device, comprising:

patterning a first fin of a p-type fin-type field effect transistor (p-FinFET) on a {110} crystalline oriented surface of a first substrate;

patterning a second fin of an n-type fin-type field effect transistor (n-FinFET) on a {100} crystalline oriented surface of a second substrate, said second substrate being bonded and adjacent to said first substrate in said dual-plane CMOS device;

forming a first tri-gate over a first center region of said first fin and a second tri-gate over a second center region of said second fin, wherein:

said first fin extends from said first center region via a first fin source region to a first source contact region and via a first fin drain region to a first drain contact region of said p-FinFET, and said second fin extends from said second center region via a second fin source region to a second source contact region and via a second fin drain region to a second drain contact region of said n-FinFET;

forming a first spacer around said first tri-gate and on portions of said first fin, and a second spacer around said second tri-gate and on portions of said second fin;

depositing a dielectric on portions of said first substrate located between said first source contact region and said first drain contact region, and said first spacer and said first fin, and on portions of said second substrate located between said second source contact region and said second drain contact region, and said second spacer and said second fin;

exposing portions of said first substrate and said second substrate proximate to said first and second spacers and said first and second fins;

growing a strain inducing material on said exposed portions of said first substrate and said second substrate, wherein said strain inducing material applies stress to said first center region of said first fin of said p-FinFET and to said second center region of said second fin of said n-FinFET of said dual-plane CMOS device; and forming a tensile strain layer over at least said n-FinFET.

9. The method according to claim 8, wherein strain inducing material comprises at least one of silicon germanium and silicon carbon.

10. The method according to claim 8, further comprising forming a thick oxide member on a top face of said p-FinFET.

* * * * *